United States Patent [19]

Huynh et al.

[11] Patent Number: 5,659,773

[45] Date of Patent: Aug. 19, 1997

[54] PERSONAL COMPUTER WITH INPUT/OUTPUT SUBSYSTEM

[75] Inventors: Duy Quoc Huynh; Loc Tien Tran; Raymond Roger Trombly; Prabhakara Rao Vadapalli, all of Boca Raton, Fla.

[73] Assignee: International Business Machines Corporation, Armonk, N.Y.

[21] Appl. No.: 612,738

[22] Filed: Nov. 14, 1990

[51] Int. Cl.⁶ .................. G06F 3/00; G06F 9/02
[52] U.S. Cl. .................. 395/821; 364/232.7; 364/232.8; 364/238.2; 364/238.3; 364/DIG. 1
[58] Field of Search .................. 395/275, 325, 395/800

[56] References Cited

U.S. PATENT DOCUMENTS

| | | | |
|---|---|---|---|
| 3,819,989 | 6/1974 | Braune | 317/101 F |
| 3,827,056 | 7/1974 | Vano | 346/74 E |
| 4,087,146 | 5/1978 | Hudson, Jr. | 339/17 F |
| 4,159,516 | 6/1979 | Henrion et al. | 395/275 |
| 4,293,924 | 10/1981 | Struger et al. | 395/275 |
| 4,700,880 | 10/1987 | Glover | 228/180.1 |
| 4,800,462 | 1/1989 | Zacher et al. | 361/413 |
| 4,846,705 | 7/1989 | Brunnenmeyer | 439/78 |
| 4,850,883 | 7/1989 | Kabadi | 439/67 |
| 4,974,192 | 11/1990 | Face et al. | 395/275 |
| 5,020,999 | 6/1991 | Dewitt et al. | 439/328 |

*Primary Examiner*—Kevin J. Teska
*Assistant Examiner*—Ayni Mohamed
*Attorney, Agent, or Firm*—Daniel E. McConnell

[57] ABSTRACT

This invention relates to personal computers, and to the handling of input/output signals exchanged between a microprocessor included within a personal computer and devices remote from the microprocessor. In addition to the microprocessor and a system board mounting the microprocessor, a personal computer in accordance with this invention has an input/output signal processing circuit for performing logical operations on digital signals passing to and from the microprocessor and preparing such signals for operative communication between the microprocessor and devices remote from the microprocessor, a second circuit board for mounting the circuit, a board connector mounting the second circuit board on the system board, an input/output connector for passing signals to and from the circuit for receipt from and delivery to devices remote from the microprocessor, and a signal communicating member extending between the circuit and the input/output connector for operatively communicating signals therebetween.

13 Claims, 5 Drawing Sheets

PERSONAL COMPUTER WITH INPUT/ OUTPUT SUBSYSTEM

TECHNICAL FIELD

This invention relates to personal computers, and more particularly to the handling of input/output signals exchanged between a microprocessor included within a personal computer and devices remote from the microprocessor.

BACKGROUND OF THE INVENTION

Personal computer systems in general and IBM personal computers in particular have attained widespread use for providing computer power to many segments of today's modern society. Personal computer systems can usually be defined as a desk top, floor standing, or portable microcomputer that consists of a system unit having a single system processor and associated volatile and non-volatile memory, a display monitor, a keyboard, one or more diskette drives, a fixed disk storage, and an optional printer. One of the distinguishing characteristics of these systems is the use of a motherboard or system planar to electrically connect these components together. These systems are designed primarily to give independent computing power to a single user and are inexpensively priced for purchase by individuals or small businesses. Examples of such personal computer systems are IBM's PERSONAL COMPUTER AT and IBM's PERSONAL SYSTEM/2 Models 25, 30, 50, 60, 70 and 80.

These systems can be classified into two general families. The first family, usually referred to as Family I Models, use a bus architecture exemplified by the IBM PERSONAL COMPUTER AT and other "IBM compatible" machines. The second family, referred to as Family II Models, use IBM's MICRO CHANNEL bus architecture exemplified by IBM's PERSONAL SYSTEM/2 Models 50 through 80. The Family I models typically have used the popular Intel Corporation 8088 or 8086 microprocessor as the system processor. These processors have the ability to address one megabyte of memory. The Family II models typically use the high speed Intel Corporation 80286, 80386, and 80486 microprocessors which can operate in a real mode to emulate the slower speed Intel Corporation 8086 microprocessor or a protected mode which extends the addressing range from 1 megabyte to 4 Gigabytes for some models. In essence, the real mode feature of the 80286, 80386, and 80486 processors provide hardware compatibility with software written for the 8086 and 8088 microprocessors.

In such personal computers, it has been conventional to follow good engineering design practice for the circuit board which typically mounts the system microprocessor and provides the conductive pathways by which digital signals flow to and from the microprocessor. Such circuit boards are known as system boards, motherboards or planars. A typical motherboard is manufactured as a multiple layer board having a layout of circuit components and ground areas designed to place input/output signal handling circuits adjacent the entry point of such signals into the pathways provided in the planar, provide appropriate components for suppression of the effects of electromagnetic interference, and establish a "clean" or "quiet" ground grid adjacent such an entry point. Persons skilled in the arts of planar design have been taught to follow such design practices by those who have prepared engineering papers and monographs on such subjects, and it is deemed not necessary to provide a detailed teaching of such skills here.

While such design approaches have enabled the manufacture and use of personal computers appropriately shielded against the possibly adverse effects of electromagnetic interference (EMI), thereby providing electromagnetic compatibility (EMC), a planar so designed is restricted to the particular input/output pathways for which the board was originally designed. Variation, and enhancement after the original design has been "frozen", is extremely difficult if not impossible without major modification of the planar. Thus a planar design, once established, is not readily susceptible to improvement and addition of new input/output capabilities or characteristics.

BRIEF DESCRIPTION OF THE INVENTION

With the foregoing discussion in mind, it is an object of this invention to facilitate the handling of input/output signals in a personal computer. In realizing this object of the present invention, interface circuitry which performs the necessary logical processes for handling of input/output signals is isolated onto an "island" circuit board, thereby permitting ready revision or alteration of the circuitry. Additionally, device drivers and EMI suppressors are separated and placed conveniently to external connectors so that the necessary effort toward electromagnetic compatibility is displaced into a location where such concerns are more readily resolved.

Yet a further object of this invention is to isolate the planar, system board or motherboard from external noise transmitted through connecting cables or the like. In realizing this object of the present invention, the point of connection at which input/output circuits passing signals to devices remote from the microprocessor enter and exit an enclosure for the computer is established by a separate connector panel. As used herein, the word "remote" as referenced to the separation between an input/output device and the microprocessor intends only a separation, rather than implying a significant distance between those components. The distance may be substantial, as established by a modem connection through telephone lines or the like, or merely a matter of a few inches, as established with an accessory display or plotter.

BRIEF DESCRIPTION OF THE DRAWINGS

Some of the objects of the invention having been stated, other objects will appear as the description proceeds, when taken in connection with the accompanying drawings, in which:

FIG. 3 (comprising 3A and 3B) is a schematic view of certain components of the personal computer of FIGS. 1 and 2;

DETAILED DESCRIPTION OF THE INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
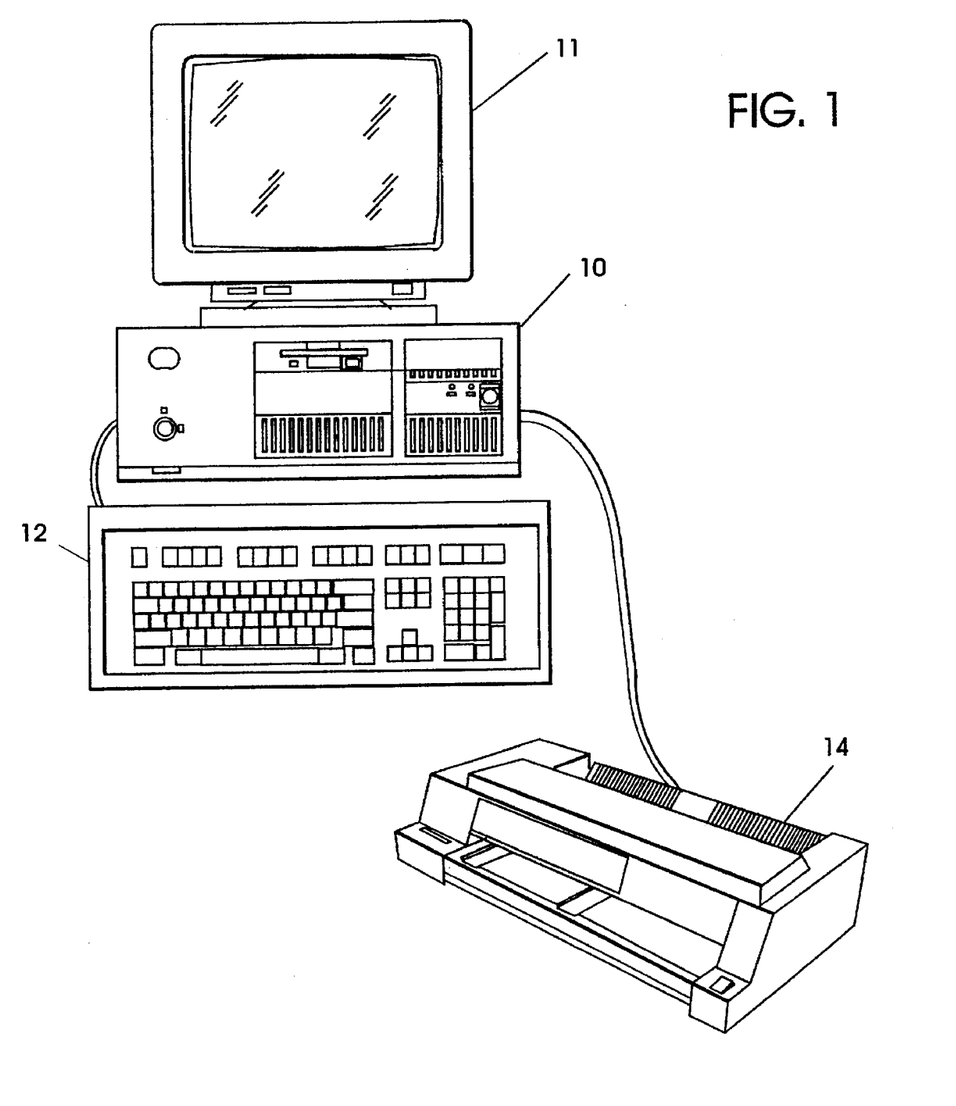
FIG. 1 is a perspective view of a personal computer embodying this invention.

Referring now more particularly to the accompanying drawings, a microcomputer embodying the present invention is there shown and generally indicated at 10 (FIG. 1). As mentioned hereinabove, the computer 10 may have an associated monitor 11, keyboard 12 and printer or plotter 14. The computer 10 has a cover 15 formed by a decorative outer member 16 (FIG. 2) and an inner shield member 18 which cooperate with a chassis 19 in defining an enclosed, shielded volume for receiving electrically powered data processing and storage components for processing and storing digital data. At least certain of these components are mounted on a multilayer planar 20 or motherboard which is mounted on the chassis 19 and provides a means for electrically interconnecting the components of the computer 10 including those identified above and such other associated elements as floppy disk drives, various forms of direct access storage devices, accessory cards or boards, and the like. As pointed out more fully hereinafter, provisions are made in the planar 20 for the passage of input/output signals to and from the operating components of the microcomputer.

Figure 2:
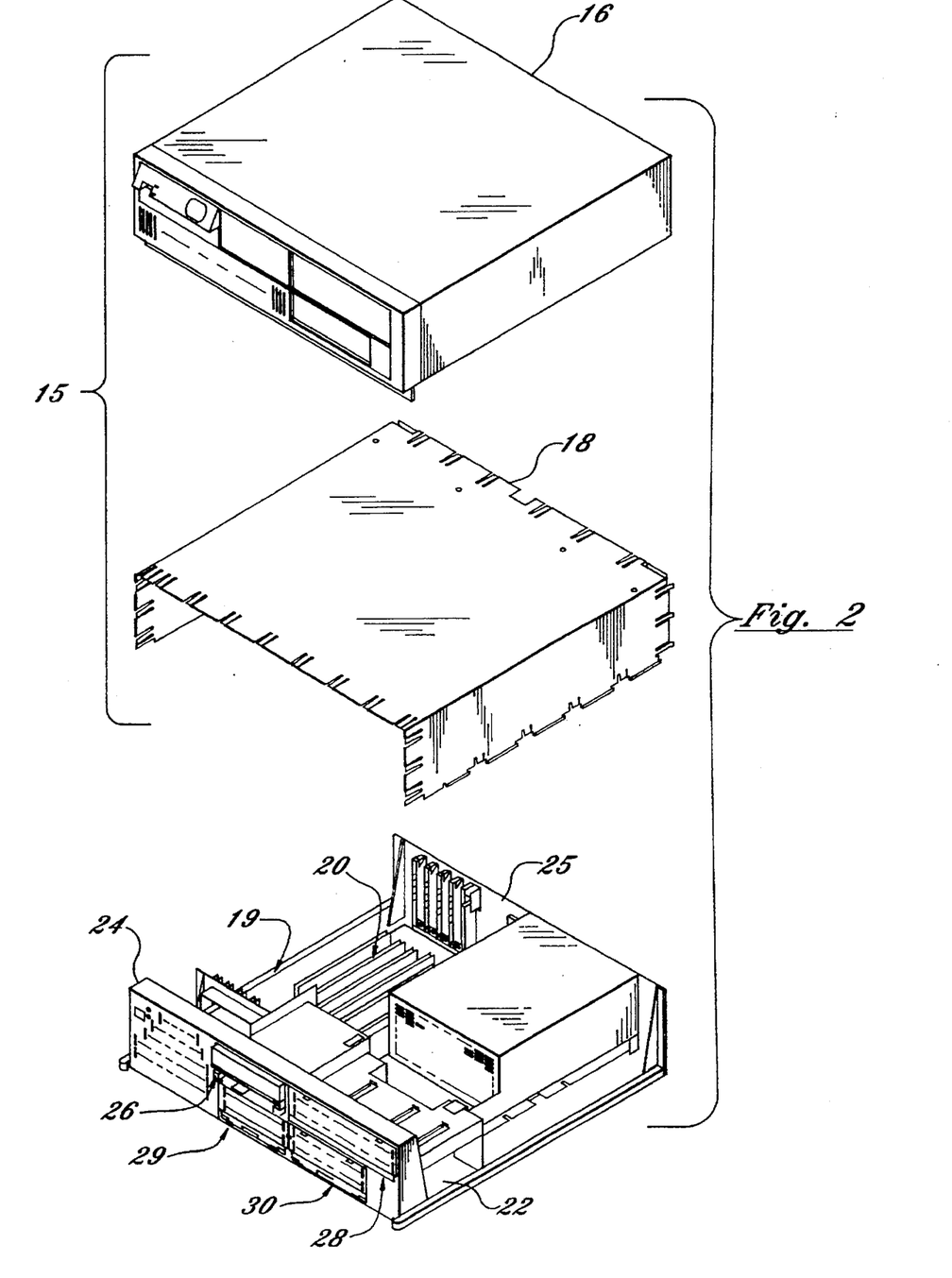
FIG. 2 is an exploded perspective view of certain elements of the personal computer of FIG. 1 including a chassis, a cover, an electromechanical direct access storage device and a planar board and illustrating certain relationships among those elements.

The chassis 19 has a base indicated at 22, a front panel indicated at 24, and a rear panel indicated at 25 (FIG. 2). The front panel 24 defines at least one open bay (and in the form illustrated, four bays) for receiving a data storage device such as a disk drive for magnetic or optical disks, a tape backup drive, or the like. In the illustrated form, a pair of upper bays 26, 28 and a pair of lower bays 29, 30 are provided. One of the upper bays 26 is adapted to receive peripheral drives of a first size (such as those known as 3.5 inch drives) while the other 28 is adapted to receive drives of a selected one of two sizes (such as 3.5 and 5.25 inch) and the lower bays are adapted to receive devices of only one size (3.5 inch). One floppy disk drive is indicated at 80 in FIG. 1, and is a removable media direct access storage device capable of receiving a diskette inserted thereinto and using the diskette to receive, store and deliver data as is generally known.

Figures 3, 3B:
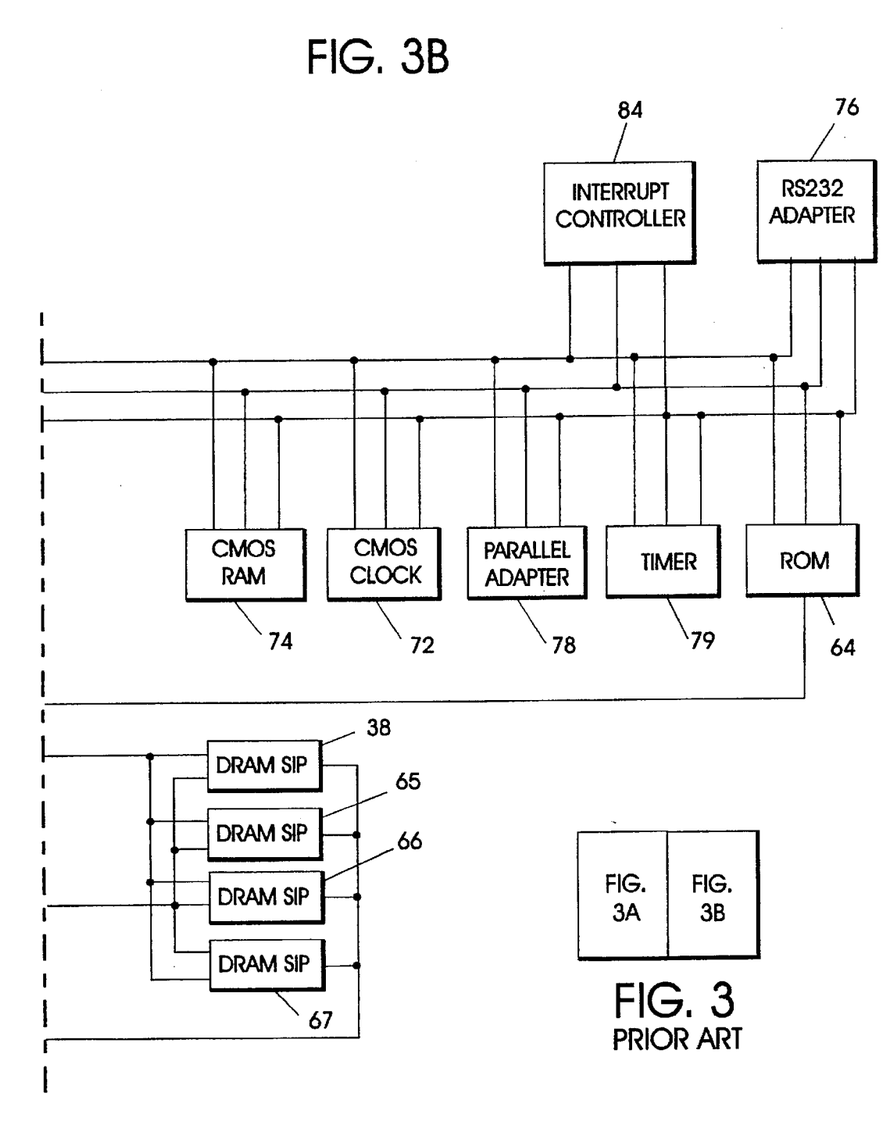
Figure 3A:
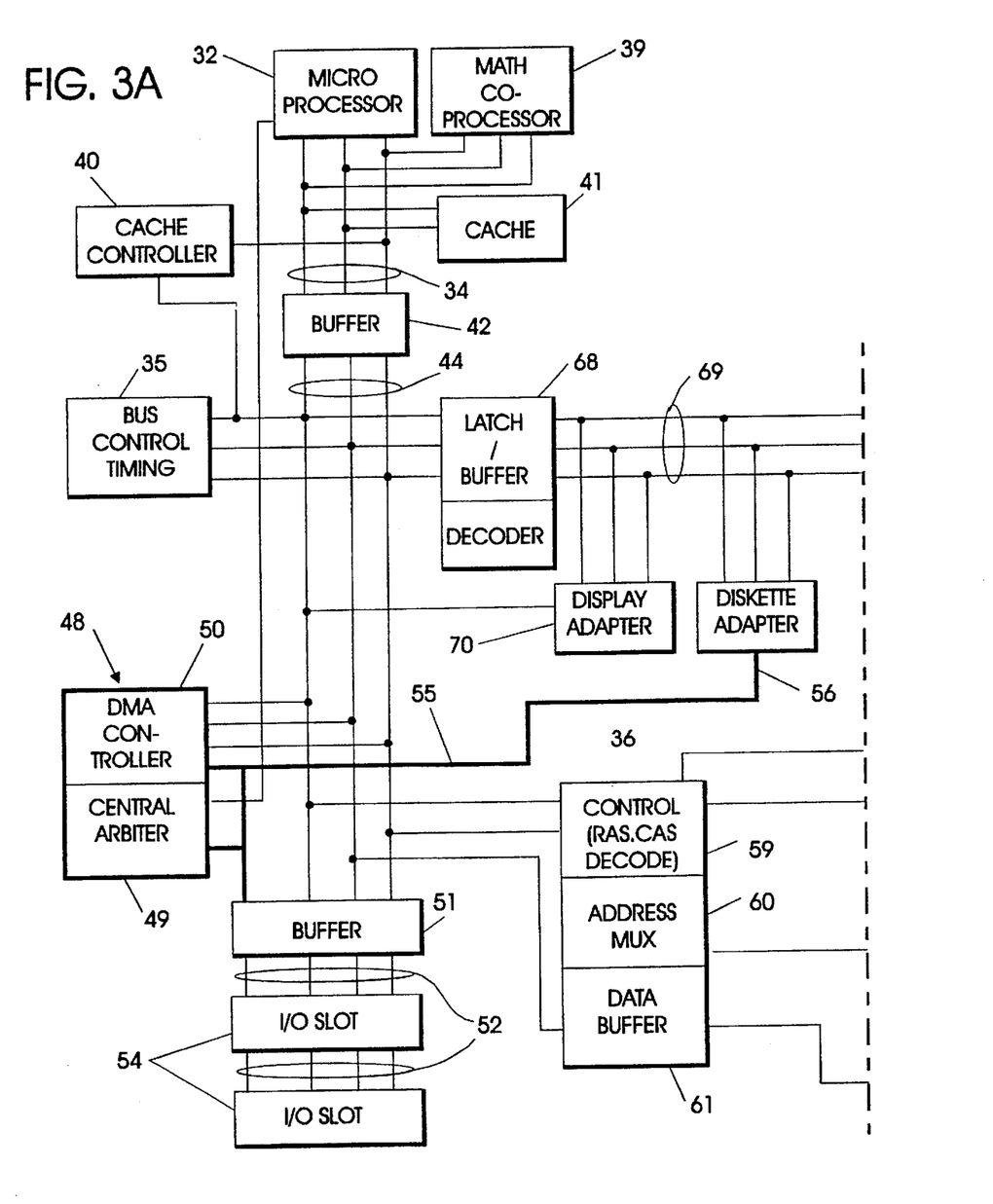

Prior to relating the above structure to the present invention, a summary of the operation in general of the personal computer system 10 may merit review. Referring to FIG. 3, there is shown a block diagram of a personal computer system illustrating the various components of the computer system such as the system 10 in accordance with the present invention, including components mounted on the planar 20 and the connection of the planar to the I/O slots and other hardware of the personal computer system. Connected to the planar is the system processor 32 comprised of a microprocessor which is connected by a high speed CPU local bus 34 through a bus control timing unit 35 to a memory control unit 36 which is further connected to a volatile random access memory (RAM) 38. While any appropriate microprocessor can be used, one suitable microprocessor is the 80386 which is sold by INTEL.

While the present invention is described hereinafter with particular reference to the system block diagram of FIG. 3, it is to be understood at the outset of the description which follows that it is contemplated that the apparatus and methods in accordance with the present invention may be used with other hardware configurations of the planar board. For example, the system processor could be an Intel 80286 or 80486 microprocessor.

Returning now to FIG. 3, the CPU local bus 34 (comprising data, address and control components) provides for the connection of the microprocessor 32, a math coprocessor 39, a cache controller 40, and a cache memory 41. Also coupled on the CPU local bus 34 is a buffer 42. The buffer 42 is itself connected to a slower speed (compared to the CPU local bus) system bus 44, also comprising address, data and control components. The system bus 44 extends between the buffer 42 and a further buffer 68. The system bus 44 is further connected to a bus control and timing unit 35 and a DMA unit 48. The DMA unit 48 is comprised of a central arbitration unit 49 and DMA controller 50. The buffer 51 provides an interface between the system bus 44 and an optional feature bus such as the MICRO CHANNEL bus 52. Connected to the bus 52 are a plurality of I/O slots 54 for receiving MICRO CHANNEL adapter cards which may be further connected to an I/O device or memory.

An arbitration control bus 55 couples the DMA controller 50 and central arbitration unit 49 to the I/O slots 54 and a diskette adapter 56. Also connected to the system bus 44 is a memory control unit 36 which is comprised of a memory controller 59, an address multiplexor 60, and a data buffer 61. The memory control unit 36 is further connected to a random access memory as represented by the RAM module 38. The memory controller 36 includes the logic for mapping addresses to and from the microprocessor 32 to particular areas of RAM 38. This logic is used to reclaim RAM previously occupied by BIOS. Further generated by memory controller 36 is a ROM select signal (ROMSEL), that is used to enable or disable ROM 64.

While the microcomputer system 10 is shown with a basic 1 megabyte RAM module, it is understood that additional memory can be interconnected as represented in FIG. 3 by the optional memory modules 65 through 67. For purposes of illustration only, the present invention is described with reference to the basic one megabyte memory module 38.

A latch buffer 68 is coupled between the system bus 44 and a planar I/O bus 69. The planar I/O bus 69 includes address, data, and control components respectively. Coupled along the planar I/O bus 69 are a variety of I/O adapters and other components such as the display adapter 70 (which is used to drive the monitor 11), a CMOS clock 72, nonvolatile CMOS RAM 74 hereinafter referred to as NVRAM, a RS232 adapter 76, a parallel adapter 78, a plurality of timers 80, a diskette adapter 56, an interrupt controller 84, and a read only memory 64. The read only memory 64 includes the BIOS that is used to interface between the I/O devices and the operating system of the microprocessor 32. BIOS stored in ROM 64 can be copied into RAM 38 to decrease the execution time of BIOS. ROM 64 is further responsive (via ROMSEL signal) to memory controller 36. If ROM 64 is enabled by memory controller 36, BIOS is executed out of ROM. If ROM 64 is disabled by memory controller 36, ROM is not responsive to address enquiries from the microprocessor 32 (i.e. BIOS is executed out of RAM).

The planar I/O bus 69, as described hereinafter, includes portions defined by conductive pathways formed in interior layers of the multilayer planar 20, and particularly includes a number of such pathways in a portion extending adjacent an edge of the planar 20 which is positioned to extend adjacent one of the front and rear panels of the chassis. Such design of the planar makes possible the location of a number of I/O connectors along such a side edge for exchange of signals with such devices as the monitor, keyboard and printer.

The clock 72 is used for time of day calculations and the NVRAM is used to store system configuration data. That is, the NVRAM will contain values which describe the present configuration of the system. For example, NVRAM contains information describing the capacity of a fixed disk or diskette, the type of display, the amount of memory, time, date, etc. Of particular importance NVRAM will contain data (can be one bit) which is used by memory controller 36 to determine whether BIOS is run out of ROM or RAM and whether to reclaim RAM intended to be used by BIOS RAM. Furthermore, these data are stored in NVRAM whenever a special configuration program, such as SET Configuration, is executed. The purpose of the SET Configuration program is to store values characterizing the configuration of the system to NVRAM.

As mentioned hereinabove, the computer has a cover indicated generally at 15 which cooperates with the chassis 19 in forming an enclosed, shielded volume for containing the above identified components of the microcomputer. The cover preferably is formed with an outer decorative cover member 16 which is a unitary molded component made of a moldable synthetic material and a metallic thin sheet liner 18 formed to conform to the configuration of the decorative cover member. However, the cover can be made in other known ways and the utility of this invention is not limited to enclosures of the type described.

Figure 4:
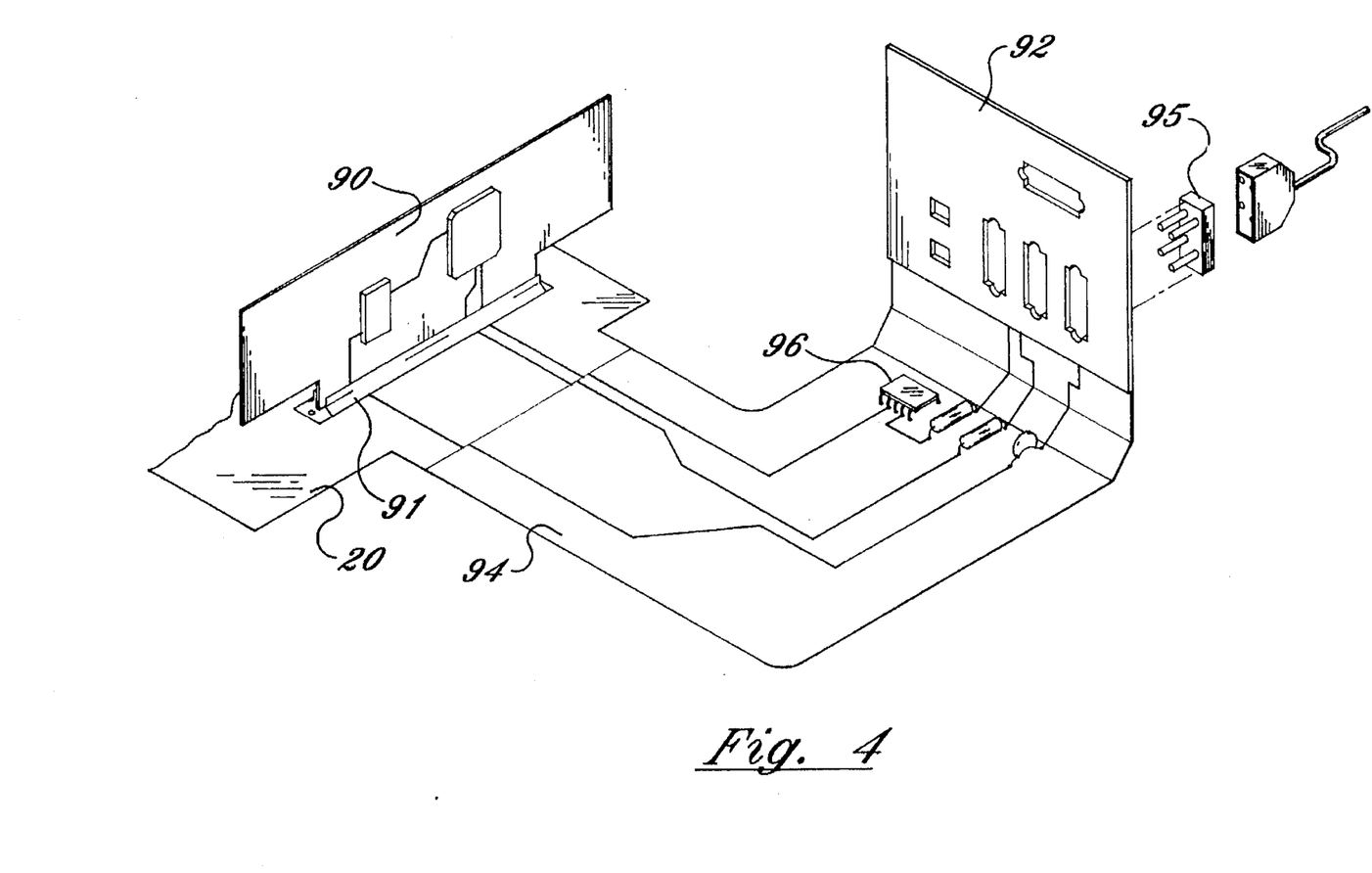
FIG. 4 is a schematic perspective view of certain elements in accordance with this invention as they are used in the computer of FIGS. 1 through 3 to establish pathways for input/output signals.

Referring now more particularly to FIG. 4, the present invention contemplates that the possible effects of electromagnetic interference can be controlled while achieving the desirable result of enabling adaptation of the computer design described to variation in input/output arrangements through use of a second circuit board 90 for mounting the input/output signal processing circuit(s) which perform logical operations on digital signals passing to and from the microprocessor 32 and prepare such signals for operative communication between the microprocessor and devices remote from the microprocessor such as the printer 14, etc. The second circuit board 90, which may also be referred to as an "island" board due to its separation of input/output (I/O) functions from other functions of the computer circuitry, is mounted on and connected to the system planar 20 by a suitable board connector 91. The board 90 and connector 91 provide appropriate communication of signals to and from the system planar board 20 and devices remote from the microprocessor 32.

Further, in order to isolate the planar 20 and the I/O logic circuitry provided on the island board 90 from external noise introduced through cables or the like, the present invention contemplates providing an appropriately shielding ground, also known as a "clean" or "quiet" ground for the I/O signal pathways, and connections with devices external to the enclosure 15, 19 for the computer which are established through an input/output connector panel 92 desirably configured to mount a plurality of electromechanical connectors such as an illustrated connector 95. The connectors mounted by the panel 92 may, for example, include one or more serial connectors, one or more parallel connectors, a keyboard connector, a video display connector, a pointing device connector, and the like. Such connectors mounted on the panel 92 are joined to the system planar 20, and thence to the island board 90 by a suitable signal communicating member 94 extending between the I/O circuits on the island board and the input/output connector(s) on the panel 92 for operatively communicating signals between the circuit(s) and input/output connector(s). The connectors are joined to external devices such as the monitor 11 by appropriate external cables, as well known. In the form shown, and as preferred for this invention, the signal communicating member 94 located within the enclosure is a high density flex cable. The cable desirably has within it a ground plane which provides a portion of the quiet or clean ground shielding I/O signals and packaged, integrated circuit driver devices 96 which provide at least some signal isolation between the remote I/O devices and the I/O circuitry found on the island board.

By the provision of an island board 90, a connector panel 92 and a suitable member 94 connecting the two, changes in the input/output pathways, number and placement of connectors, etc. may be made while avoiding any necessity of re-engineering the system planar board 20. Thus adaptation can be readily made to applications of the basic system planar 20 and enclosure to differing uses which require differing numbers and types of connections. Further, by providing appropriate filtering devices such as toroids, ferrite beads, decoupling capacitors and the like, as are generally known as proper engineering practice for the protection of I/O circuitry against potentially harmful effects of electromagnetic interference generated by or impinging upon such circuitry, on the connector panel 92, the island board 90 or, as illustrated, in the member 94 connecting the two, electromagnetic compatibility is achieved while the desired design flexibility is maintained. The design flexibility achieved will be understood as enabling ready change in the logic circuitry of the I/O island board 90 without necessitating change in the connector panel 92, or vice versa. Further, such flexibility is achieved while maintaining the necessary EMI capability through placement of the shielding grounds and filtering components as described above.

In the drawings and specifications there has been set forth a preferred embodiment of the invention and, although specific terms are used, the description thus given uses terminology in a generic and descriptive sense only and not for purposes of limitation.

What is claimed is:

1. A personal computer comprising:

a microprocessor for processing digital signals, a first circuit board for mounting said microprocessor and providing operative communication of digital signals to and from said microprocessor, an input/output signal processing circuit for performing logical operations on digital signals passing to and from said microprocessor and preparing such signals for operative communication between said microprocessor and devices remote from said microprocessor, a second circuit board for mounting said input/output signal processing circuit, a board connector mounting said second circuit board on said first circuit board, said second board and said board connector providing operative communication of digital signals between said input/output signal processing circuit and said microprocessor, an input/output connector for passing signals to and from said input/output signal processing circuit for receipt from and delivery to devices remote from said microprocessor, and a signal communicating member extending between said input/output signal processing circuit and said input/output connector for operatively communicating signals between input/output signal processing said circuit and said input/output connector.

2. A personal computer according to claim 1 wherein said input/output signal processing circuit comprises electromagnetic interference suppressing components for suppressing interference effects otherwise possibly resulting from preparation of input/output signals for exchange between said microprocessor and devices remote from said microprocessor and the impact of external sources on cables and the like external to the personal computer.

3. A personal computer according to claim 1 wherein said signal communicating member comprises a multiconductor cable assembly.

4. A personal computer according to claim 1 further comprising an enclosure enclosing said first and second boards, said board and input/output connectors, and said member, and further wherein said input/output connector is mounted within said enclosure for access from without said enclosure.

5. A personal computer according to claim 1 wherein all input/output signals are passed through said input/output signal processing circuit, said board and input/output connectors, and said signal communicating member.

6. A personal computer according to claim 1 wherein all input/output signals are passed through said first and second boards.

7. A personal computer system having a high speed system processor compatible with application programs and operating system software designed to execute on slower speed system processors, said personal computer system comprising:

a high speed microprocessor for processing digital signals and having a real and protected mode of operation, said microprocessor being operatively coupled to a high speed data bus;

a first circuit board for mounting said microprocessor and providing operative communication of digital signals to and from said microprocessor;

an input/output signal processing circuit for performing logical operations on digital signals passing to and from said microprocessor and preparing such signals for operative communication between said microprocessor and devices remote from said microprocessor;

a second circuit board for mounting said input/output signal processing circuit;

a board connector mounting said second circuit board on said first circuit board;

said second board and said board connector providing operative communication of digital signals between said input/output signal processing circuit and said microprocessor;

non-volatile memory operatively coupled to a slower speed data bus;

a bus controller for providing communications between the high speed data bus and the slower speed data bus;

volatile memory responsive to the high speed data bus;

a memory controller operatively coupled to said volatile memory and said non-volatile memory, said memory controller regulating communications between said volatile memory and said high speed microprocessor;

an input/output connector for passing signals to and from said input/output signal processing circuit for receipt from and delivery to devices remote from said microprocessor; and a signal communicating member extending between said input/output signal processing circuit and said input/output connector for operatively communicating signals between said input/output signal processing circuit and said input/output connector.

8. A personal computer according to claim 7 wherein said input/output signal processing circuit comprises electromagnetic interference suppressing components for suppressing interference effects otherwise possibly resulting from preparation of input/output signals for exchange between said microprocessor and devices remote from said microprocessor and the impact of external sources on cables and the like external to the personal computer.

9. A personal computer according to claim 7 wherein said signal communicating member comprises a multiconductor cable assembly.

10. A personal computer according to claim 7 further comprising an enclosure enclosing said first and second boards, said board and input/output connectors, and said member, and further wherein said input/output connector is mounted within said enclosure for access from without said enclosure.

11. A personal computer according to claim 7 wherein all input/output signals are passed through said input/output signal processing circuit, said board and input/output connectors, and said signal communicating member.

12. A personal computer according to claim 7 wherein all input/output signals are passed through said first and second boards.

13. A personal computer system having a high speed system processor compatible with application programs and operating system software designed to execute on slower speed system processors, said personal computer system comprising:

a high speed microprocessor for processing digital signals and having a real and protected mode of operation, said microprocessor being operatively coupled to a high speed data bus;

a first circuit board for mounting said microprocessor and providing operative communication of digital signals to and from said microprocessor;

an input/output signal processing circuit for performing logical operations on digital signals passing to and from said microprocessor and preparing for operative communication between said microprocessor and devices remote from said microprocessor all such signals so exchanged, said input/output signal processing circuit having electromagnetic interference suppressing components for suppressing interference effects otherwise possibly generated by preparation of input/output signals for exchange between said microprocessor and devices remote from said microprocessor;

a second circuit board for mounting said input/output signal processing circuit;

a board connector mounting said second circuit board on said first circuit board;

said second board and said board connector providing operative communication of digital signals exchanged between said input/output signal processing circuit and said microprocessor and for communication of all such signals exchanged between said input/output signal processing circuit and devices remote from said microprocessor;

non-volatile memory operatively coupled to a slower speed data bus;

a bus controller for providing communications between the high speed data bus and the slower, speed data bus;

volatile memory responsive to the high speed data bus;

a memory controller operatively coupled to said volatile memory and said non-volatile memory, said memory controller regulating communications between said volatile memory and said high speed microprocessor;

an input/output connector for passing signals to and from said input/output signal processing circuit for receipt from and delivery to devices remote from said microprocessor;

an enclosure enclosing said first and second boards, said board and input/output connectors, said input/output connector being mounted within said enclosure for access from without said enclosure; and a multiconductor cable signal communicating member enclosed within said enclosure and extending between said first circuit board and said input/output connector for cooperating with said first and second circuit boards in operatively communicating between said input/output signal processing circuit and said input/output connector all signals exchanged with devices remote from said microprocessor.

* * * * *